United States Patent [19]

Frerichs

[11] Patent Number: 5,388,070
[45] Date of Patent: Feb. 7, 1995

[54] STORAGE ARRANGEMENT AND METHOD FOR OPERATING THE ARRANGEMENT

[75] Inventor: Heinz-Peter Frerichs, Hamburg, Germany

[73] Assignee: U.S. Philips Corporation, New York, N.Y.

[21] Appl. No.: 226,227

[22] Filed: Apr. 11, 1994

Related U.S. Application Data

[63] Continuation of Ser. No. 75,708, Jun. 11, 1993.

[30] Foreign Application Priority Data

Jun. 13, 1992 [DE] Germany ............................. 4219464

[51] Int. Cl.⁶ ........................ G11C 11/34; G11C 7/00
[52] U.S. Cl. .................................... 365/185; 365/104; 365/189.09
[58] Field of Search ...................... 365/185, 189.9, 104, 365/182

[56] References Cited

U.S. PATENT DOCUMENTS

| | | | |
|---|---|---|---|
| 4,720,816 | 1/1988 | Matsuoka | 365/185 X |
| 4,823,318 | 4/1989 | D'Arrigo | 365/185 X |
| 4,954,990 | 9/1990 | Vider | 365/185 |
| 4,982,364 | 1/1991 | Iwahashi | 365/189.9 |
| 5,001,668 | 3/1991 | Ito | 365/189.9 |
| 5,051,953 | 9/1991 | Kitazawa | 365/185 |
| 5,197,028 | 3/1993 | Nakai | 365/185 |
| 5,229,963 | 7/1993 | Ohtsuka | 365/185 |

Primary Examiner—Eugene R. LaRoche
Assistant Examiner—Son Mai

[57] ABSTRACT

The optimum programming voltage in programmable storage arrangements such as EPROMs and notably EEPROMs is dependent on manufacturing tolerances which are difficult to determine from the outside. Therefore, steps are proposed which enable optimum adjustment of the programming voltage by utilizing an additional transistor with a floating gate which is of the same construction as the transistors of the storage cells and which thus also has the same properties in respect of the programming voltage. This additional transistor is connected in series between the high voltage customarily generated on the chip and the programming voltage input of the actual storage matrix. A description is given of a circuit and a sequence of control voltages required by the circuit so as to adjust the additional transistor.

4 Claims, 2 Drawing Sheets

STORAGE ARRANGEMENT AND METHOD FOR OPERATING THE ARRANGEMENT

This is a continuation of application Ser. No. 08/075,708, filed Jun. 11, 1993 pending.

FIELD OF THE INVENTION

The invention relates to an integrated storage arrangement, comprising a matrix of addressable, electrically programmable storage cells, each of which comprises a MOS transistor with a floating gate whose charge can be controlled by means of a programming voltage and each of which also comprises a control gate, the arrangement also comprising a control circuit which comprises a voltage input for receiving a high voltage which is higher than the desired programming voltage, a voltage output for supplying the programming voltage, and an additional transistor whose construction is the same as that of the transistors of the storage cells and which serves to derive from the high voltage a programming voltage of substantially optimum value with a view to manufacturing tolerances.

BACKGROUND OF THE INVENTION

A storage arrangement of this kind is known from U.S. Pat. No. 4,954,990. Memories comprising storage cells which comprise a respective MOS transistor with a floating gate are referred to as EPROMs. This means that the individual storage cells can be electrically programmed. Each storage cell contains a bit of a value which depends on whether the floating gate of the storage cell transistor is charged, i.e. programmed, or not. Programming is performed by means of a programming voltage which is applied to given terminals of the transistor of the desired storage cell in order to store a charge on the floating gate.

The value of the programming voltage must be accurately controlled to some extent. When the programming voltage is too high, the storage cell could be destroyed or at least damaged during programming, so that frequent reprogramming is no longer possible. When the programming voltage is too low, the individual storage cells will not be unambiguously programmed, i.e. when they are read it will not be unambiguously clear which value is supposed to be stored. The range of the programming voltage in which neither damaging of the storage cells occurs nor ambiguous programming of the storage cells is possible, however, depends to a given extent on manufacturing tolerances of the integrated memory and is very difficult to determine from outside the memory. Therefore, for the various memories manufactured it is practically impossible to indicate a value of the programming voltage which lies each time within the individual optimum voltage range of the relevant memory.

In the memory arrangement according to the cited U.S. Pat. No. 4,954,990, an additional transistor, having the same properties as the transistors of the storage cells, is used to derive the programming voltage applied to the actual storage matrix from a higher programming voltage or high voltage in such a manner that the programming voltage has a substantially optimum value for the relevant memory. To this end, the current through the additional transistor is measured during application of the high voltage and in dependence on this current the programming voltage is influenced, via a plurality of current mirrors, so that the programming voltage is reduced as the current is larger. This circuit arrangement, however, requires further voltage dividers as well as a large number of components and its operation is not very reliable.

SUMMARY OF THE INVENTION

It is an object of the invention to construct a storage arrangement of the kind set forth so that the programming voltage can be adjusted to a substantially optimum value in a simple and reliable manner.

This object is achieved in accordance with the invention in that the drain of the additional transistor is coupled to the voltage output, that the source of the additional transistor can be coupled, via a first switch, to a control voltage input and, via a second switch, to the voltage input, and that the control gate of the additional transistor can be coupled, via a third switch, to the reference voltage and, at least via a fourth switch, to the voltage input.

Appropriate control of the switches in the control circuit of the storage arrangement in accordance with the invention enables such programming of the additional transistor that its drain outputs substantially accurately the optimum programming voltage which is dependent on manufacturing tolerances. The programming voltage is reliably adjusted to a substantially optimum value, because this adjustment utilizes only the properties of the additional transistor and no further elements.

Because EPROMs and notably EEPROMs are constructed using exclusively MOS transistors and the control circuit for generating the programming voltage forms part of the integrated storage arrangement, the switches therein are preferably also constructed by means of MOS transistors. Therefore, an embodiment of the invention is characterized in that when the transistors of the storage cells are constructed as NMOS transistors, the first and the third switch are constructed as NMOS transistors whereas the second and the fourth switch are constructed as PMOS transistors, the gates of the first and the second switch being controllable together via a first control input, whereas the gates of the third and the fourth switch are controllable together via a second control input. This construction enables full control of the storage arrangement in accordance with the invention via only two control inputs for adjustment of the generating of the desired programming voltage.

During the programming of the memory, the transistor of the selected storage cell does not receive the programming voltage directly, but via a selection circuit which comprises at least a part of the address decoding circuitry. In order to take this into account in adjusting the additional transistor for generating the optimum programming voltage, a further embodiment of the invention is characterized in that between the fourth switch and the control gate of the additional transistor there is connected a further NMOS transistor whose gate is connected to the terminal connected to the fourth switch, the control gate of the additional transistor being connectable to the voltage input via a fifth switch which is also constructed as a PMOS transistor and which can be controlled via the first control input. The further transistor thus imitates the selection circuit whereas during normal operation this further transistor is quasibridged by the fifth switch so that the voltage at the control gate no longer influences the adjusted threshold value of the additional transistor.

A method for operating the storage arrangement in accordance with the invention, intended to derive a programming voltage with a substantially optimum value from a high voltage in a simple and reliable manner, in accordance with the invention is characterized in that the programming voltage is generated at the drain of the additional transistor whose source is coupled to the high voltage during normal storage operation and whose control gate carries essentially the potential of the high voltage, that at least prior to the first activation of the memory the additional transistor receives, during a first adjustment step, a low voltage at its control gate and essentially the high voltage at its source for a period of time which suffices for complete programming of the additional transistor, thus setting it to the normally turned-on state, and that for a period of time corresponding to the programming period of the storage cells, during a second adjustment step essentially the high voltage is applied to its control gate whereas its source receives an adjusting voltage which is valued between the reference voltage and a fraction of the high voltage in conformity with the desired properties of the memory during operation.

Thus, in accordance with the invention the storage properties of the additional transistor are utilized in that prior to the first activation of the memory this transistor is programmed to a threshold value which corresponds essentially to the difference between the high voltage and the programming voltage required for the programming of the additional transistor and hence also of the transistors of the storage cells. For normal operation the additional transistor is then operated as a source follower with the programmed threshold voltage.

BRIEF DESCRIPTION OF THE DRAWINGS

Embodiments of the invention will be described in detail hereinafter with reference to the drawing. Therein.

DESCRIPTION OF THE PREFERRED EMBODIMENTS

Figure 1:
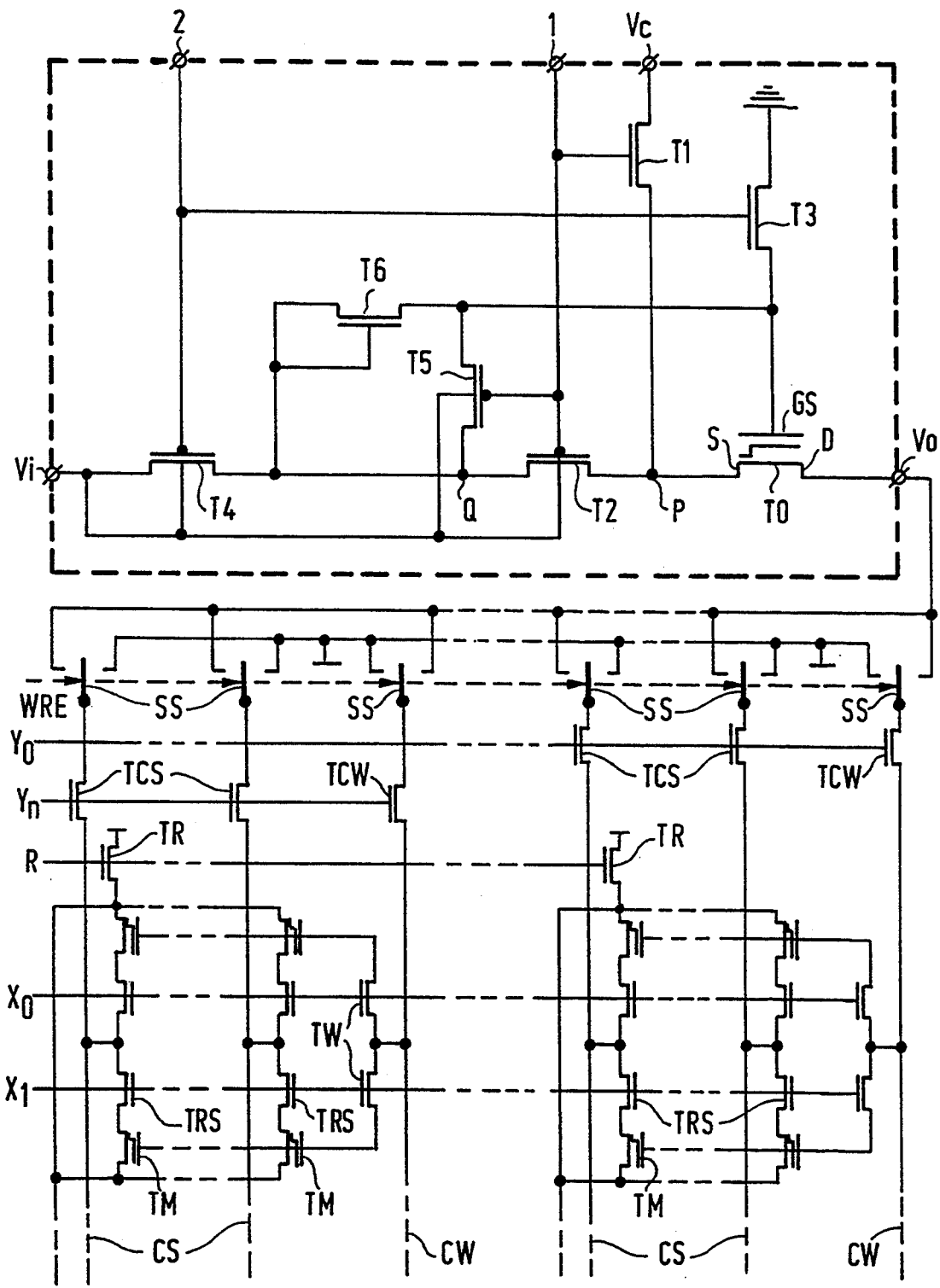
FIG. 1 shows a storage arrangement in accordance with the invention, comprising a control circuit for the programming voltage.

The bottom part of FIG. 1 shows some of the elements of a storage device comprising storage transistors TM with a floating gate whose charge can be controlled. There are also provided a number of selection transistors TRS and TCS. With each storage transistor TM there is associated a selection transistor TRS. These pairs of storage transistors TM and selection transistors TRS are arranged in the form of a matrix of rows and columns, only the first two rows of the first and the last column being shown for the sake of clarity. The individual rows of the matrix are selected via row address leads $X_0$, $X_1$ etc., which are controlled by an address decoder (not shown). The bits of a memory word are written and read in parallel in each row, only the elements of the first and the last bit of each memory word being indicated for the sake of simplicity.

The individual columns are selected via column selection leads SS whereto one end of series connections of a storage transistor TM and a selection transistor TRS is connected. The selection leads CS are connected to column selection transistors TCS which are controlled via column address leads $Y_0$ to $Y_n$ (for a matrix comprising n+1 columns), which leads themselves are fed by address decoders (not shown). The column address leads $Y_0$ to $Y_n$ also control write selection transistors TCW which are connected to write selection leads CW which are active only in the write mode and additionally also in the erase mode.

The other ends of the selection transistors TCS and TCW are connected to selection switches SS which comprise three positions and which are shown merely as mechanical switches for the sake of simplicity; however, in practice they will likewise be realised by means of transistors and be controlled together so as to adjust a write mode, a read mode or an erase mode of the memory.

In the left-hand position of the selection switches SS, not shown in FIG. 1, the selection transistors TCS are connected to a lead for a programming voltage which is supplied by an output Vo of a control circuit C in the upper part of FIG. 1. However, additional control takes place by the information to be written (not shown in FIG. 1), i.e. only the selection transistors TCS for the bits of one binary value of the words to be written are connected to the programming voltage. Thus, the column selection leads CS of the column driven by the column address lead Y also carry the programming voltage, depending on the information to be written. Because at the same time only one of the row address leads is driven, for example $X_1$, via the row selection transistors TRS thus turned on the programming voltage appears on one terminal of the group of storage transistors TM, depending on the information to be written.

At the same time, in this left-hand position of the selection switches SS a reference potential, for example ground potential, is applied to the selection transistors TCW, so that in the selected column the selection lead CW also carries this reference potential. Via the selection transistor TW, being connected to this selection lead CW and driven at the same time by the row address lead, the reference potential is thus applied to the gates of the storage transistors which receive the programming voltage via the selected column leads CS and the selected row selection transistors TRS, so that the programming voltage is then present between the relevant terminal of the storage transistors TM and the gates of these transistors, with the result that the floating gate of these storage transistors is charged via the tunnel effect.

In the read mode, in the central position of the selection switches SS (i.e. the position shown) one terminal of the selection transistors TCS is open and at the same time read transistors TR are driven via the input R, connecting the one terminal of all storage transistors TM to reference potential. The storage transistors TM whose floating gate has been charged during writing, then connect this reference potential to one terminal of the associated row selection transistors TRS in a comparatively low-ohmic manner; this potential is transferred, in dependence on the row selected by the row address lead X, to the leads CS which in this case operate as read leads. Because only one of the column address leads Y is driven, the leads CS of only one column are connected to the selection switches SS which can then take up the word read in the position shown.

In the right-hand position of the selection switches SS, determining the erase mode of the memory, the column selection leads CS of the selected column are connected to the reference potential and, via the selected row selection transistors TRS, this reference potential is applied to one terminal of the storage transistors TM of a selected memory word. At the same time, via the selection transistor TCW of the selected column, the programming voltage is applied to the column lead CW, which programming voltage is applied, via the selected selection transistor TW, to the gates of the storage transistors TM of the selected data word, so that any charge present on the floating gate of these storage transistors is removed again by way of the tunnel effect.

The programming voltage present between one terminal and the gate of the storage transistors of a selected memory word in the write mode and the erase mode, therefore, must be so high that for the duration of writing or erasure an adequate amount of charge is transported to or from the floating gate of these transistors. On the other hand, this programming voltage may not be substantially higher, because otherwise these storage transistors could be damaged and the number of write and erase cycles be reduced or the error rate increased. Therefore, the programming voltage for the storage device is generated by a control circuit C which is shown at the top of FIG. 1.

Therein, a transistor T0 of the same construction as the storage transistors TM of the storage matrix comprises a floating gate and a control gate GS. The drain D of the transistor T0 is connected to a voltage output Vo wherefrom the programming voltage for the memory can be derived. The source S of the transistor T0 is connected to a point P which can be connected, via a first MOS transistor T1, to an adjusting voltage input Vc or, via the series connection of a second transistor T2 and a fourth transistor T4, both constructed as PMOS transistors, to the voltage input Vi whereto the high voltage is applied. The high voltage is customarily generated by a high voltage generator from a lower operating voltage of the memory which is integrated, like the circuit arrangement shown in FIG. 1, together with the memory and the associated address selection circuits.

The control gate GS of the transistor T0 is connected, via a third transistor T3, to a reference voltage and, via the series connection of a transistor T6 which is connected as a kind of diode with a fixed voltage drop and the transistor T4, to the voltage input Vi. Furthermore, via a fifth PMOS transistor T5, the control gate GS can be connected to a point Q which constitutes the connection of the two transistors T2 and T4. All transistors T1 to T6, that is to say all transistors except the transistor T0, are customary normally turned off MOS transistors. The gates of the transistors T1, T2 and T5 are connected to a first control input 1, and the gates of the transistors T3 and T4 are connected to a second control input 2.

In order to adjust the programming voltage at the voltage output Vo, the control inputs 1 and 2 as well as the adjusting voltage input Vc receive voltages as indicated in the Table during two successive adjusting steps and the subsequent normal operation, the voltage input Vi continuously receiving a constant high voltage Vh.

TABLE

|  | step 1 | step 2 | normal operation |
|---|---|---|---|
| 1 | $\geq$ Vh | $\geq$ Vh | 0 V |
| 2 | $\geq$ Vh | 0 V | 0 V |
| Vc | Vh | 0 ... 5 V | — |

Figure 2A:
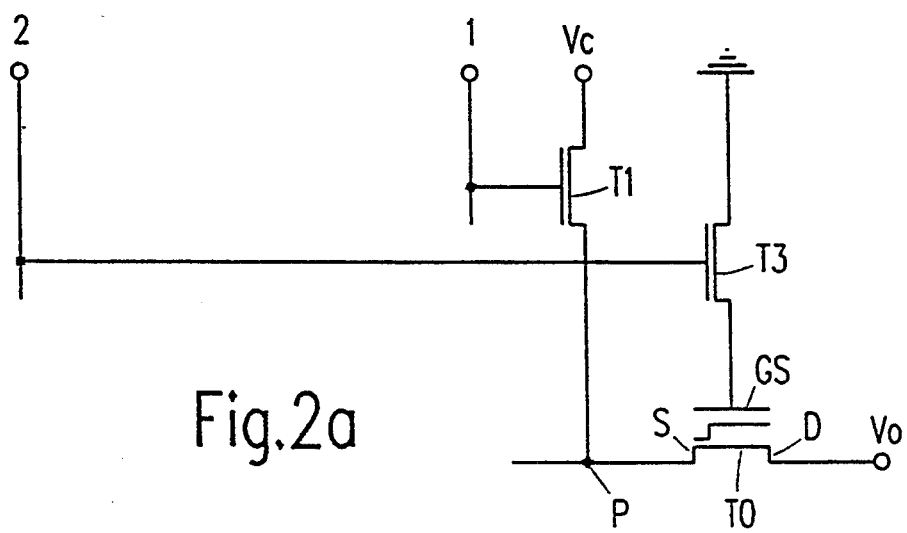
FIGS. 2a to 2c show the elements of this control circuit which are active during the individual adjustment steps and during normal operation.

During step 1, the adjusting voltage input thus receives the high voltage Vh which is also present at the voltage input Vi. The control inputs 1 and 2 also receive the high voltage Vh, or possibly a higher voltage wherefrom the high voltage Vh is derived by a stabilization circuit. The exact value of these voltages is not critical, because it is only important that during this step the transistors T2, T4 and T5 are turned off and the transistors T1 and T3 are turned on. This is the case already when the voltages at the control inputs 1 and 2 are equal to the high voltage Vh, because the transistor T4 is of enhancement type and, consequently, the circuit point Q floats, whereas the transistor T3 customarily has a threshold voltage which is much lower than the high voltage, so that this transistor will definitely be turned on and connect the control gate GS of the transistor T0 to reference potential as shown in FIG. 2a. Via the transistor T1, the circuit point P carries a voltage which is lower than the voltage at the control input 1 by an amount equal to the threshold voltage of the transistor T1, but which at the most equals the voltage at the adjusting voltage input Vc. The transistor T0 is thus programmed, i.e. it enters the normally turned-on state in which it conducts substantially without voltage drop when the gate GS is connected to the source S. This demonstrates that the voltage at the control input 1 need not be accurately defined for as long as it suffices to set the transistor T0 reliably to the state shown.

On the basis of this unambiguously defined state of the transistor T0, the second step of the adjusting procedure is performed; during this step the control input 2 receives essentially reference potential and a voltage between the reference voltage and a fraction of the high voltage is applied to the adjusting voltage input Vc. The more exact value of this voltage will be explained in detail hereinafter. The control input 1 still receives a high voltage.

Figure 2B:
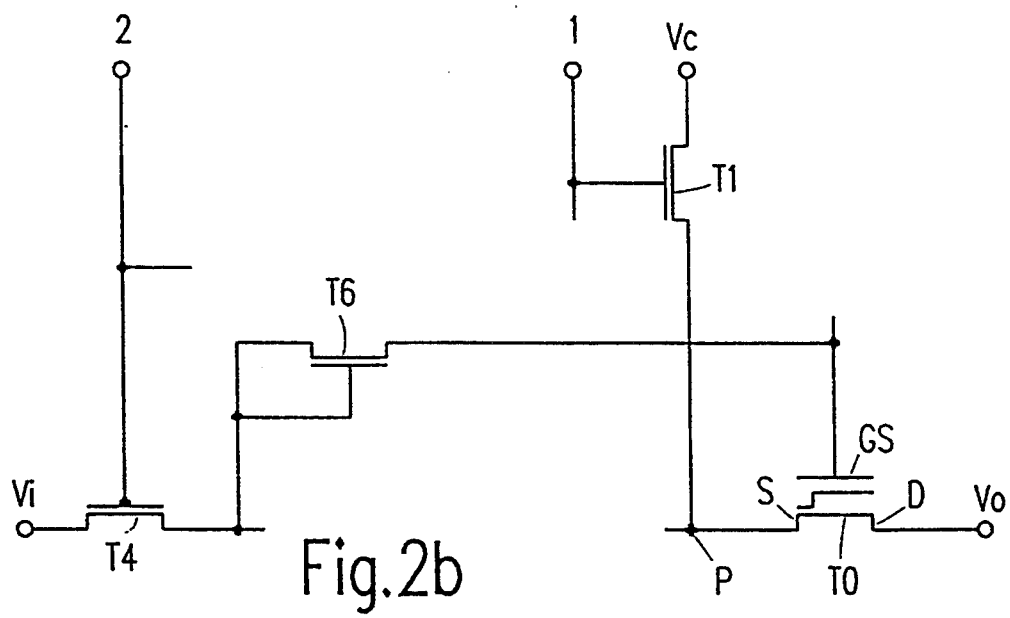

FIG. 2b shows the transistors which are then active. The transistor T3 is turned off and hence inactive, because it is a normally turned-off type, as already mentioned, and one terminal and the gate are both connected to reference potential. The transistor T1, however, is fully conductive without voltage drop, because the voltage at the control input 1, and hence at its gate, is substantially more positive than the voltage at the adjusting voltage input Vc, which thus also determines the voltage of the circuit node P and hence the voltage at the source S of the transistor T0.

Because of the low voltage at the control input 2, the transistor T4 is then turned on so that the circuit node Q also carries the high voltage Vh which is also applied to the voltage input Vi; this high voltage, minus the threshold voltage of the transistor T6, is applied to the gate GS of the transistor T0. The transistor T6 represents the access transistors in the storage matrix, so that the transistors in the storage cells thereof receive a programming voltage which is lower by an amount equal to the threshold voltage of the access transistors.

For the time being it is assumed that the voltage at the adjusting voltage input Vc, and hence also at the circuit point P and at the source S of the transistor T0, is equal to the reference voltage. As a result, the transistor T0 is reprogrammed, i.e. partly erased in the context of EEPROMs, so that the threshold voltage of the transistor T0 is shifted to positive values. The value of the threshold voltage then occurring depends on various factors. First of all, the shift is greater as the value of the high voltage is higher. Because the generator for generating the high voltage is integrated on the chip of the memory itself, continuous compensation in respect of the value of this high voltage is thus achieved. However, when on the other hand the manufacturing dependent properties of the transistor T0 require, for example a lower programming voltage, the threshold voltage automatically increases for the predetermined voltages applied to the source S and the control gate GS, and hence the programming voltage also decreases in normal operating conditions, because the transistors of the storage cells, like the additional transistor T0, require a lower programming voltage. In the reverse case, i.e. when a higher programming voltage is required, the same holds. Manufacturing tolerances of the memory, having an effect on the required or optimum programming voltage of the individual storage transistors, are thus automatically compensated for to a substantial degree.

The duration of the second step of the adjusting procedure, during which the indicated voltages are applied, also has an effect. Even though a saturation value exists for the threshold voltage for the additional transistor, which value is reached after a sufficiently long period of time, during normal operation of the memory the programming procedure will be interrupted a substantial period of time before the final condition is reached; this is done to accelerate the write and erase operations of the memory; in order to take into account this effect, the duration of the second step of the adjusting procedure preferably equals essentially the programming period of the storage cells in normal operation. By prolonging the duration of the second step, the threshold voltage of the transistor T0 can be increased, and the threshold voltage can be adjusted to a lower value, when the second step has a duration which is shorter than the normal programming period during operation of the memory, which period is often determined also by an oscillator integrated on the memory chip.

A further possibility for influencing resides in the value of the adjusting voltage at the adjusting voltage input. When this value is higher than the reference voltage, the voltage difference between the control gate GS and the source S of the transistor T0 is smaller than the programming voltage received by the transistors of the storage cells during normal operation, so that even though these transistors are exposed to a slightly increased voltage stress, they reach an unambiguous programmed state within a short period of time. The voltage at the adjusting voltage input Vc can thus be used, to a given extent, to determine the programming period with which the memory can be reliably operated at a later stage.

The described adjusting procedure for obtaining a programming voltage with a substantially manufacture-dependent optimum value need be carried out only once before the first activation of the memory, for example as a termination of the manufacturing and test procedure, because the setting of transistors with a floating gate has a very high long-term stability, in the same way as data that can be stored for prolonged periods of time. If desirable, however, the adjusting procedure can be repeated at any time, for example also whenever an apparatus in which the memory is included is switched on.

Figure 2C:
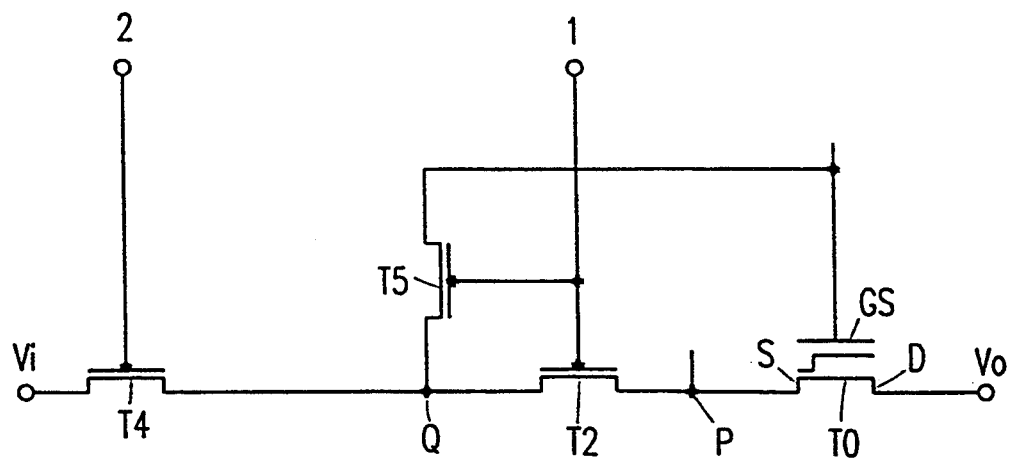

During normal operation both control inputs 1 and 2 receive reference potential, so that the transistor T1 is turned off and the voltage at the adjusting voltage input Vc is irrelevant for as long as it is not negative. The transistor T3 is still turned off. Because of the low potential at the control input 1, however, the transistor T2 is now turned on so that the source of the transistor T0 is coupled to the voltage input Vi and receives the high voltage Vh; furthermore, the transistor T5 is turned on so that the control gate GS of the transistor T0 is directly connected to the circuit node Q which carries the high voltage Vh. Consequently, the transistor T6 is inactive. This state is shown in FIG. 2c. A programming voltage which is lower than the high voltage Vh at the voltage input Vi by an amount equal to the previously adjusted threshold voltage of the transistor T0 then arises at the drain D of the transistor T0 and hence at the voltage output Vo.

Evidently, the circuit node Q can also be connected directly to the voltage input Vi, so that the transistor T4 feeds the control gate of the transistor T0 only during the second step of the adjusting procedure, via the transistor T6, and is substantially inactive during normal operation. This is a matter of practical implementation or arrangement of the elements on the chip.

I claim:

1. An integrated storage arrangement, comprising a matrix of addressable, electrically programmable storage cells, each of which comprises a MOS transistor with a floating gate whose charge can be controlled by means of a programming voltage and each of which also comprises a control gate, the arrangement also comprising a control circuit which comprises a voltage input for receiving a high voltage which is higher than the desired programming voltage, a voltage output for supplying the programming voltage, and an additional transistor whose construction is the same as that of the transistors of the storage cells and which serves to derive from the high voltage a programming voltage of substantially optimum value with a view to manufacturing tolerances, characterized in that the drain (D) of the additional transistor (T0) is coupled to the voltage output (Vo), that the source (S) of the additional transistor (T0) can be coupled, via a first switch (T1), to a control voltage input (Vc) and, via a second switch (T2), to the voltage input (Vi), and that the control gate (GS) of the additional transistor (T0) can be coupled, via a third switch (T3), to the reference voltage (0V) and, at least via a fourth switch (T4), to the voltage input (Vi).

2. A storage arrangement as claimed in claim 1, characterized in that when the transistors of the storage cells are constructed as NMOS transistors, the first and the third switch (T1, T3) are constructed as NMOS transistors whereas the second and the fourth switch (T2, T4) are constructed as PMOS transistors, the gates of the first and the second switch (T1, T2) being controllable together via a first control input (1) whereas the gates of the third and the fourth switch (T3, T4) are controllable together via a second control input (2).

3. A storage arrangement as claimed in claim 2, characterized in that between the fourth switch (T4) and the control gate (GS) of the additional transistor (T0) there is connected a further NMOS transistor (T6) whose gate is connected to the terminal connected to the fourth switch (T4), the control gate (GS) of the additional transistor (T0) being connectable to the voltage input (Vi) via a fifth switch (T5) which is also constructed as a PMOS transistor and which can be controlled via the first control input (1).

4. A method for operating a storage arrangement as claimed in the claim 1, characterized in that the programming voltage is generated at the drain of the additional transistor whose source is coupled to the high voltage during normal storage operation and whose control gate carries essentially the potential of the high voltage, that at least prior to the first activation of the memory the additional transistor receives, during a first adjustment step, a low voltage at its control gate and essentially the high voltage at its source for a period of time which suffices for complete programming of the additional transistor, thus setting it to the normally turned-on state, and that for a period of time corresponding to the programming period of the storage cells, during a second adjustment step essentially the high voltage is applied to its control gate whereas its source receives an adjusting voltage which is valued between the reference voltage and a fraction of the high voltage in conformity with the desired properties of the memory during operation.

* * * * *